United States Patent
Xie et al.

(10) Patent No.: US 10,290,738 B2
(45) Date of Patent: May 14, 2019

(54) METHODS OF FORMING EPI SEMICONDUCTOR MATERIAL ON A RECESSED FIN IN THE SOURCE/DRAIN REGIONS OF A FINFET DEVICE

(71) Applicant: GLOBALFOUNDRIES Inc., Grand Cayman (KY)

(72) Inventors: Ruilong Xie, Niskayuna, NY (US); Christopher M. Prindle, Poughkeepsie, NY (US); Kwan-Yong Lim, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/483,476

(22) Filed: Apr. 10, 2017

(65) Prior Publication Data

US 2018/0294348 A1    Oct. 11, 2018

(51) Int. Cl.
| | | |
|---|---|---|
| *H01L 21/311* | (2006.01) | |
| *H01L 29/78* | (2006.01) | |
| *H01L 29/66* | (2006.01) | |
| *H01L 21/265* | (2006.01) | |
| *H01L 21/225* | (2006.01) | |

(Continued)

(52) U.S. Cl.
CPC ........ *H01L 29/785* (2013.01); *H01L 21/2236* (2013.01); *H01L 21/2256* (2013.01); *H01L 21/26513* (2013.01); *H01L 29/165* (2013.01); *H01L 29/167* (2013.01); *H01L 29/66795* (2013.01)

(58) Field of Classification Search
CPC ............... H01L 29/785; H01L 21/2236; H01L 21/2256; H01L 21/26513; H01L 21/31111; H01L 29/165; H01L 29/167; H01L 29/66795
See application file for complete search history.

(56) References Cited

U.S. PATENT DOCUMENTS

| | | |
|---|---|---|
| 9,123,744 B1 | 9/2015 | Liao et al. |
| 9,159,630 B1 | 10/2015 | Wei et al. |

(Continued)

OTHER PUBLICATIONS

Notice of Allowance from related U.S. Appl. No. 15/585,800 dated Oct. 23, 2017.

(Continued)

*Primary Examiner* — Joseph C. Nicely
*Assistant Examiner* — Lamont B Koo
(74) *Attorney, Agent, or Firm* — Amerson Law Firm, PLLC

(57) ABSTRACT

One illustrative method disclosed includes, among other things, forming a gate structure around a fin and above a layer of insulating material, forming a gate spacer adjacent the gate structure and a fin spacer positioned adjacent the fin above the insulating material, the fin spacer leaving an upper surface of the fin exposed, and performing at least one etching process to remove at least a portion of the fin positioned between the fin spacer, the fin having a recessed upper surface that at least partially defines a fin recess positioned between the fin spacer. In this example, the method further includes forming an epi semiconductor material on the fin recess and removing the fin spacer from adjacent the epi semiconductor material while leaving a portion of the gate spacer in position adjacent the gate structure.

18 Claims, 10 Drawing Sheets

(51) Int. Cl.
*H01L 21/223* (2006.01)
*H01L 29/165* (2006.01)
*H01L 29/167* (2006.01)

(56) References Cited

U.S. PATENT DOCUMENTS

| | | | |
|---|---|---|---|
| 2012/0138886 A1* | 6/2012 | Kuhn | B82Y 10/00 |
| | | | 257/9 |
| 2016/0064387 A1 | 3/2016 | Jeong et al. | |
| 2016/0099352 A1* | 4/2016 | Lee | H01L 29/0653 |
| | | | 257/192 |
| 2017/0054003 A1* | 2/2017 | Liao | H01L 29/66795 |
| 2017/0069756 A1 | 3/2017 | Chiang et al. | |
| 2017/0154958 A1* | 6/2017 | Fung | H01L 29/0673 |
| 2017/0186598 A1* | 6/2017 | Goel | H01L 21/0245 |

OTHER PUBLICATIONS

Office Action from related U.S. Appl. No. 15/585,865 dated Feb. 16, 2018.

\* cited by examiner

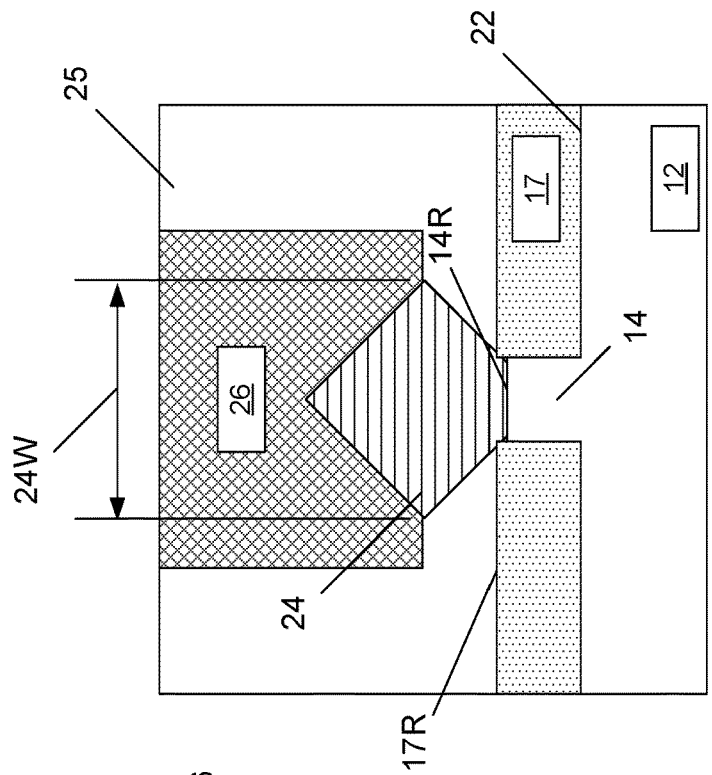
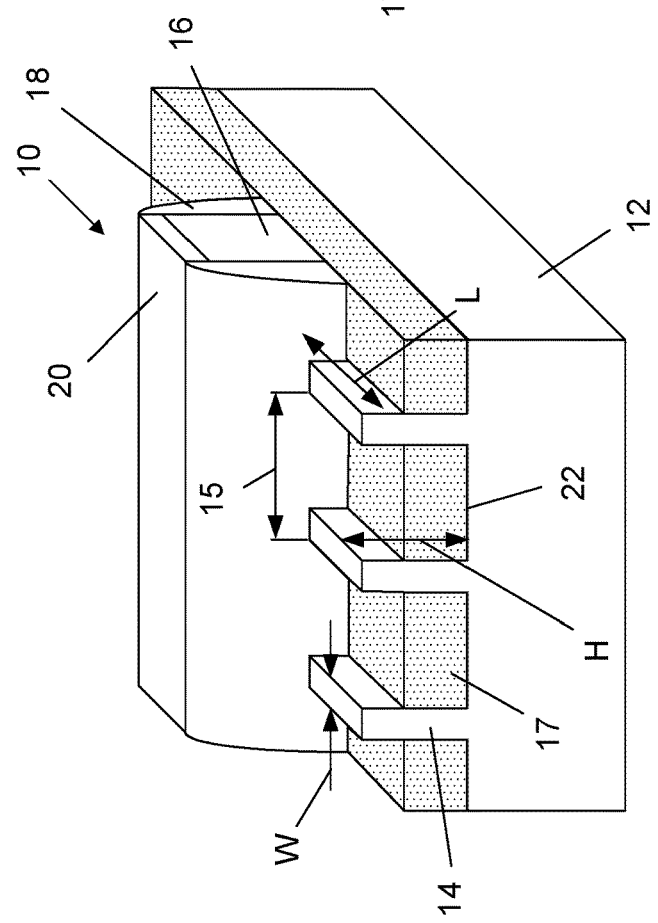
Fig. 1B
(Prior Art)
Fig.1A
(Prior Art)

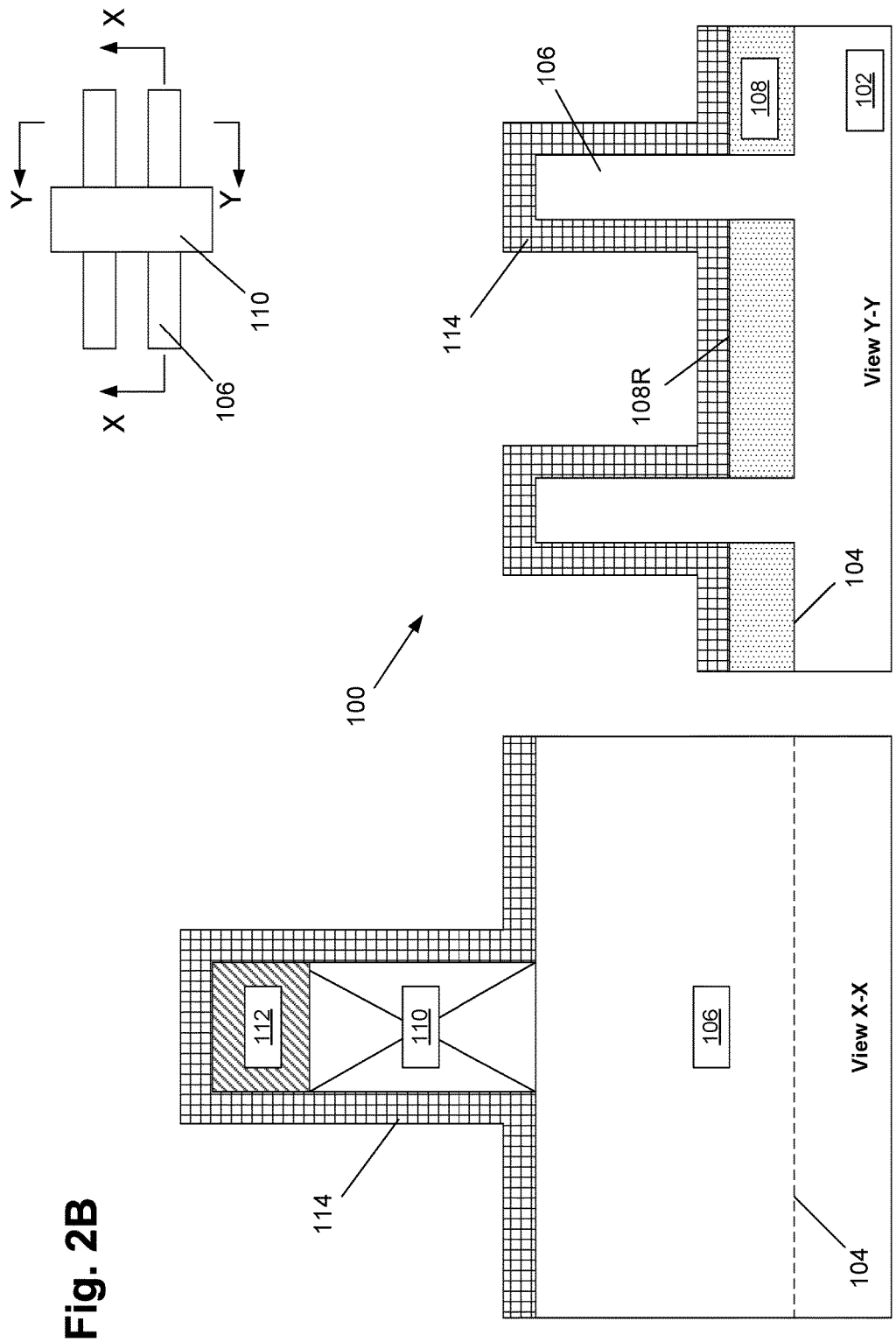

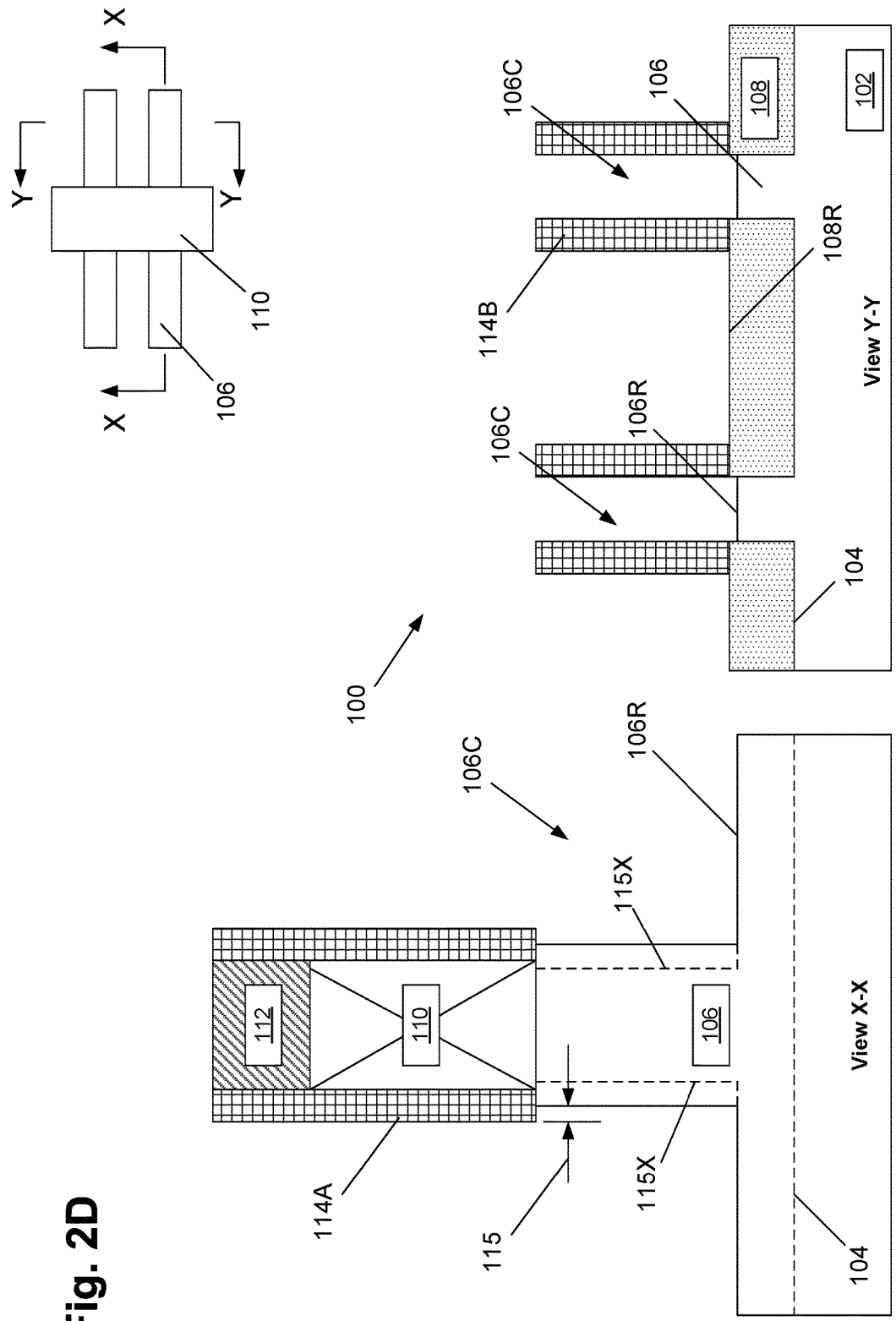

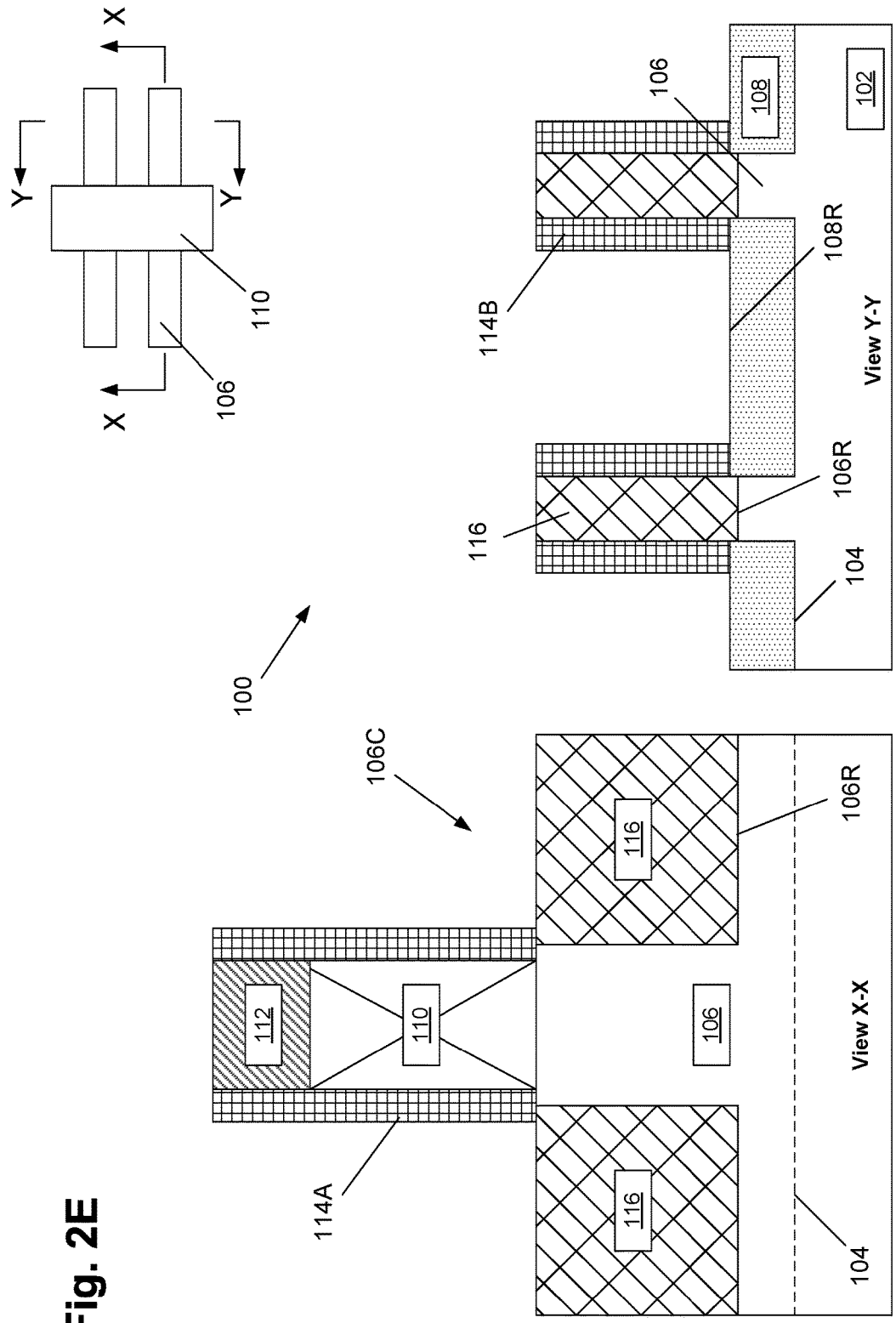

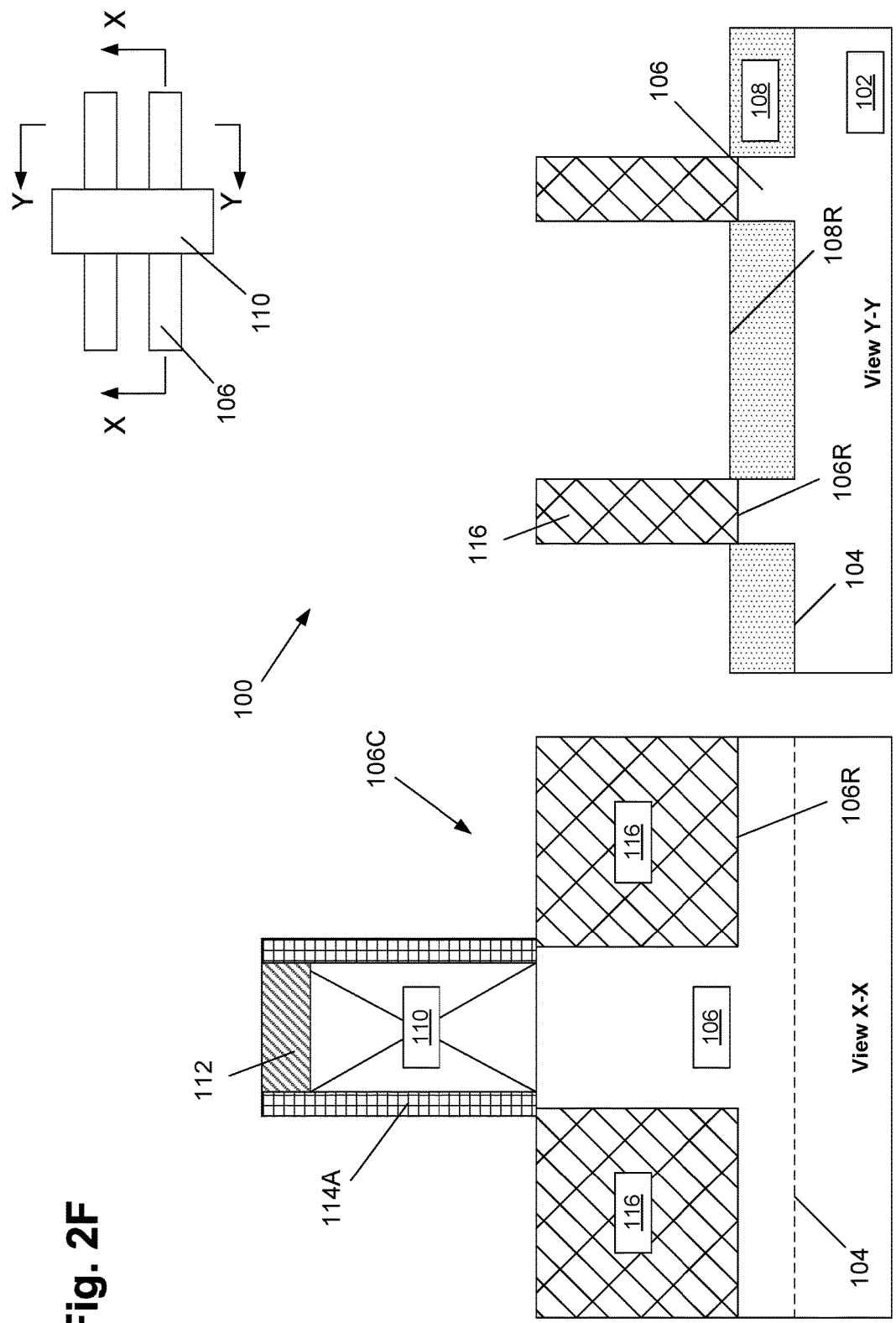

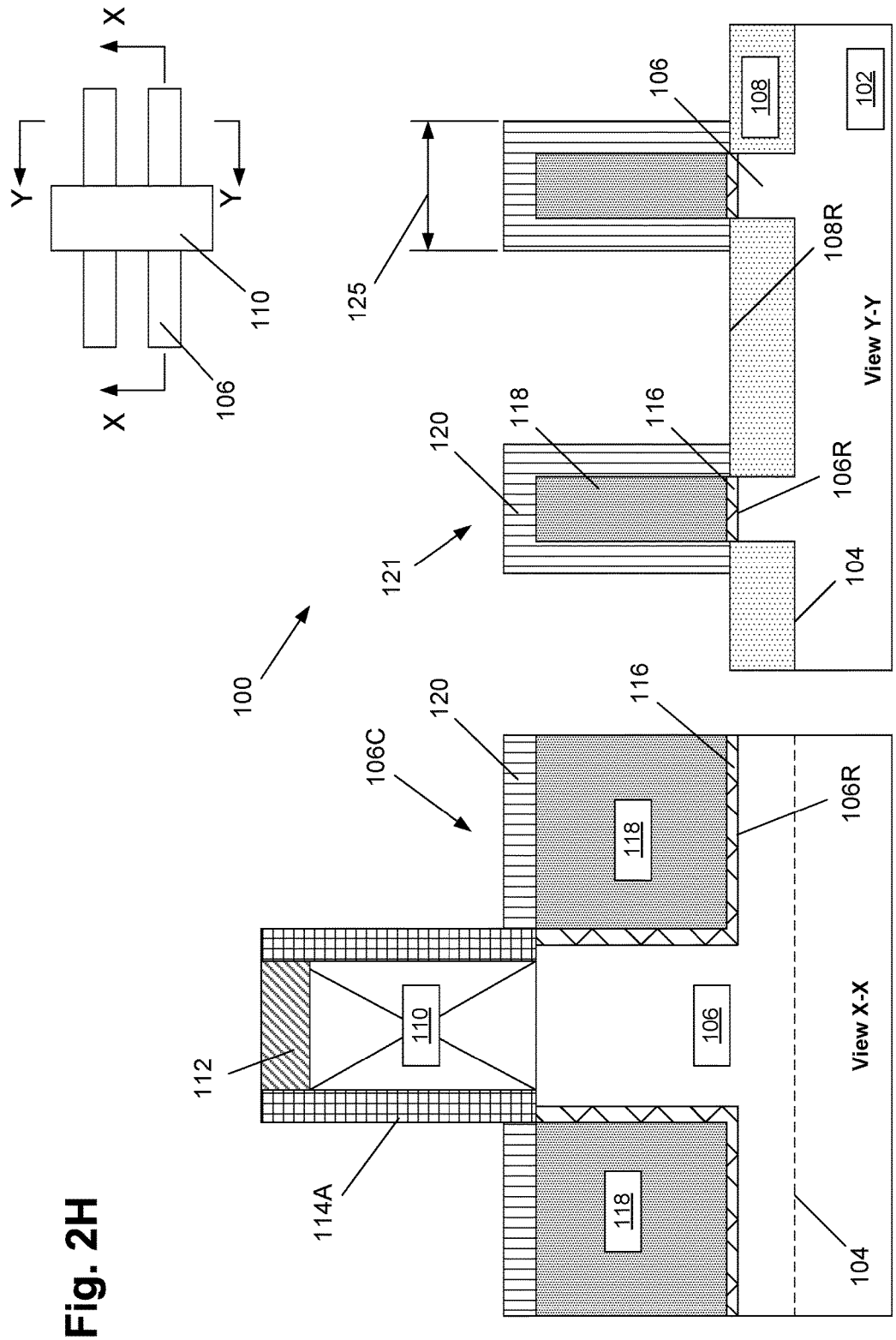

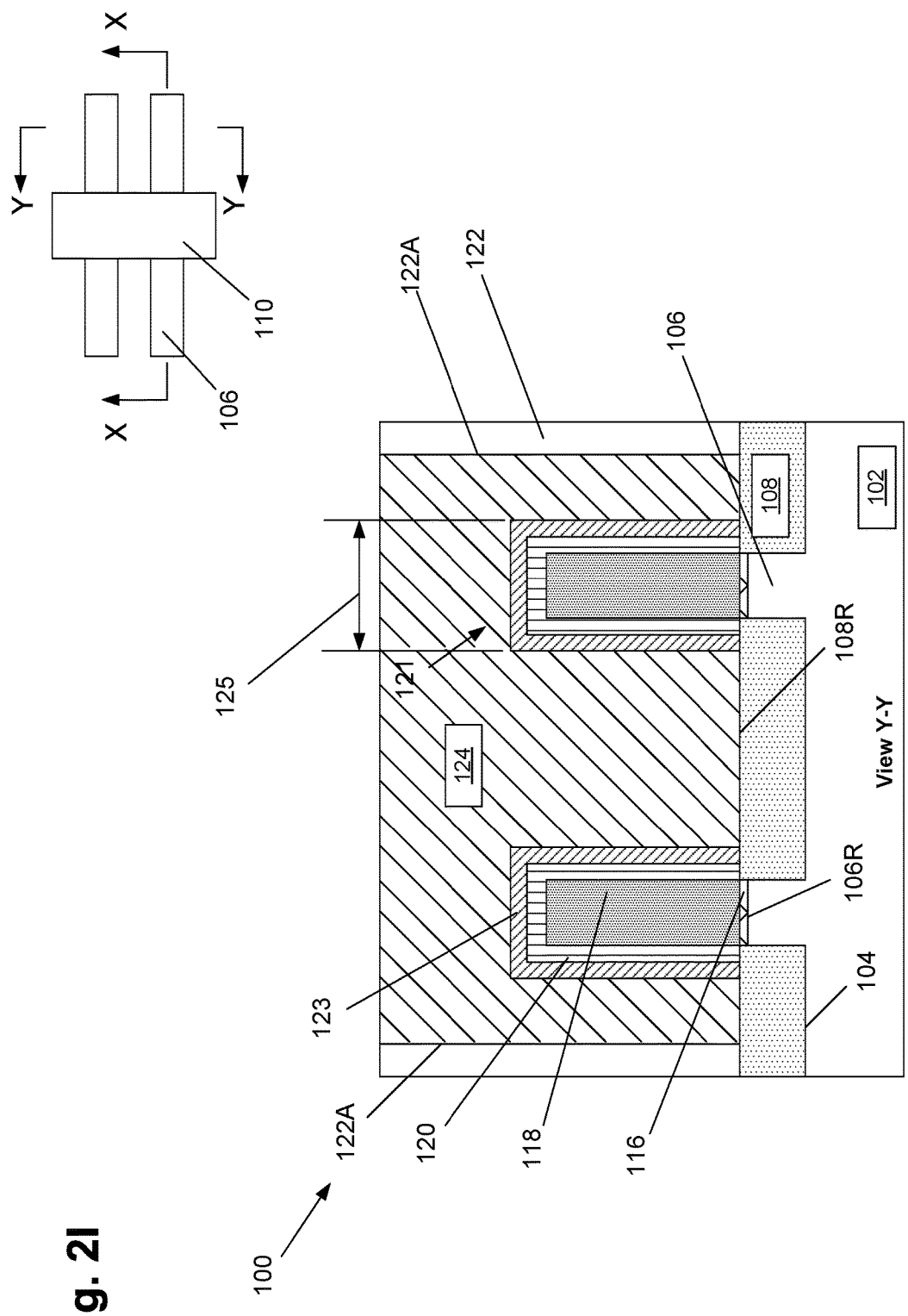

US 10,290,738 B2

METHODS OF FORMING EPI SEMICONDUCTOR MATERIAL ON A RECESSED FIN IN THE SOURCE/DRAIN REGIONS OF A FINFET DEVICE

BACKGROUND OF THE INVENTION

1. Field of the Invention

The present disclosure generally relates to the fabrication of integrated circuits, and, more particularly, to methods of forming epi semiconductor material on a recessed fin in the source/drain regions of a FinFET device and the resulting device.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

In contrast to a planar FET, which, as the name implies, is a generally planar structure, a so-called FinFET device has a three-dimensional (3D) structure. FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes three illustrative fins 14, a gate structure 16, a sidewall spacer 18 and a gate cap 20. Fin-formation trenches 22 are formed in the substrate 12 to define the fins 14. A recessed layer of insulating material 17 is positioned under the gate structure 16 and between the fins 14 in the areas outside of the gate structure, i.e., in the source/drain regions of the device 10. The gate structure 16 is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device 10. The fins 14 have a three-dimensional configuration: a height H, a width W and an axial length L. The axial length L corresponds to the direction of current travel in the device 10 when it is operational, i.e., the gate length direction of the device. The portions of the fins 14 covered by the gate structure 16 are the channel regions of the FinFET device 10. The gate structures 16 for such FinFET devices 10 may be manufactured using so-called "gate-first" or "replacement gate" (gate-last) manufacturing techniques. A FinFET device may have either a tri-gate or dual-gate channel region. For a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior FET structure as compared to that of a planar FET, especially in the 20 nm CMOS technology node and beyond.

To improve the operating speed of FETs, and to increase the density of FETs on an integrated circuit device, device designers have greatly reduced the physical size of FETs over the years, particularly the channel length of transistor devices. As it relates to FinFET devices, advanced technology nodes require that the fins 14 be formed with an ever decreasing fin pitch 15 (see FIG. 1A).

With reference to FIG. 1B, at some point during the process of manufacturing the device 10, epi semiconductor 24 will be grown on the fins in the source/drain regions of the device 10. In one prior art technique, a fin recess etching process is performed on the exposed portions of the fin 14 so as to define a recessed fin have a recessed upper surface 14R. In some cases, the fin is recessed until such time as the recessed surface 14R of the fin is at a level that is slightly below the level of the recessed upper surface 17R of the layer of insulating material 17. At that point, the epi semiconductor material 24 is grown on the recessed surface 14R of the fin 14. Typically, due to the crystallographic orientation of the material of the fins 14, the epi material 24 will grow in a somewhat diamond-shaped or mushroom-shaped configuration. Ideally, the epi semiconductor material 24 on all of the fins 14 across the substrate 12 will be substantially uniform in volume and in size. However, the formation of the diamond-shaped epi material 24, with its relatively wide lateral width 24W, makes the formation of FinFET devices with ever decreasing fin pitches problematic. That is, due to the relatively large lateral width 24W of such diamond-shaped epi material, there is a greater chance of undesirable merger with epi material 24 on adjacent fins 14 as fin pitches are reduced. Such undesirable merger of the epi materials can result in electrical shorts and/or complete device failure and lead to reduced product yields. Moreover, the large lateral width 24W of the diamond-shaped epi material 24 makes area scaling difficult. For example, when forming such diamond-shaped epi material 24, the design rules regarding fin spacing (e.g., N-P fin spacing, P-P fin spacing) have to be large enough to accommodate the large lateral width 24W of the epi material 24.

While still referencing FIG. 1B, another problem encountered using prior art techniques relates to the formation of a conductive source/drain contact structure 26 in a layer of insulating material 25 so as to electrically contact the diamond-shaped epi material 24. Given the diamond-shaped configuration of the epi material 24, the conductive source/drain contact structure 26 typically only makes contact with the upper facing surfaces of the epi material 26, i.e., the conductive source/drain contact structure 26 is not positioned around all of the surfaces of the diamond-shaped epi material 24. As a result, the contact resistance of the device may be greater than desired.

The present disclosure is directed to various methods of forming epi semiconductor material on a recessed fin in the source/drain regions of a FinFET device and the resulting device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming epi semiconductor material on a recessed fin in the source/drain regions of a FinFET device and the resulting device. One illustrative method disclosed includes, among other things, forming a gate structure around a fin and above a layer of insulating material, forming a gate spacer adjacent the gate structure and a fin spacer positioned adjacent opposing lateral sidewalls of the fin in the source/drain region above the layer of insulating material, the fin spacer leaving an upper surface of the fin exposed, and performing at least one etching process to remove at least a portion of the fin positioned between the fin spacer, the fin having a recessed upper surface that at least partially defines a fin recess positioned between the fin spacer. In this example, the method further includes forming an epi semiconductor material on the recessed upper surface of the fin and within the fin recess and removing the fin spacer from adjacent the epi semiconductor material while leaving a portion of the gate spacer in position adjacent the gate structure.

Another illustrative method disclosed herein includes, among other things, forming a gate structure around a fin and above a layer of insulating material, forming a gate spacer adjacent the gate structure and a fin spacer positioned adjacent opposing lateral sidewalls of the fin, the fin spacer leaving an upper surface of the fin exposed, and performing at least one etching process to remove at least a portion of the fin positioned between the fin spacer, the fin having a recessed upper surface that at least partially defines a fin recess positioned between the fin spacer. In this example, the method further includes forming a doped epi semiconductor material on the recessed upper surface of the fin and within the fin recess, wherein the doped epi semiconductor material has a first concentration of a first type of dopant, removing the fin spacer from adjacent the epi semiconductor material while leaving a portion of the gate spacer in position adjacent the gate structure, forming a doped region in the doped epi semiconductor, wherein the doped region has a second concentration of the first type of dopant that is greater than the first concentration, and forming a conformal epi cladding layer on substantially all surfaces of the epi semiconductor material positioned above the layer of insulating material.

One illustrative device disclosed herein includes, among other things, a gate structure positioned around a silicon fin and above a layer of insulating material, a fin recess defined in the fin and a substantially rectangular-shaped epi semiconductor material positioned on the fin and within the fin recess. In this example, the device further includes a doped region in the doped, substantially rectangular-shaped epi semiconductor material and a conformal epi cladding layer positioned on substantially all surfaces of the doped, substantially rectangular-shaped epi semiconductor material positioned above the layer of insulating material.

BRIEF DESCRIPTION OF THE DRAWINGS

The disclosure may be understood by reference to the following description taken in conjunction with the accompanying drawings, in which like reference numerals identify like elements, and in which:

FIG. 1A is a simplistic depiction of an illustrative prior art FinFET device;

FIG. 1B is a simplistic depiction of illustrative diamond-shaped epi material that may be formed on a recessed fin in the source/drain region of a FinFET device using prior art manufacturing techniques; and FIGS. 2A-2I depict various methods disclosed herein for forming epi semiconductor material on a recessed fin in the source/drain regions of a FinFET device and the resulting device.

Figure 2A:
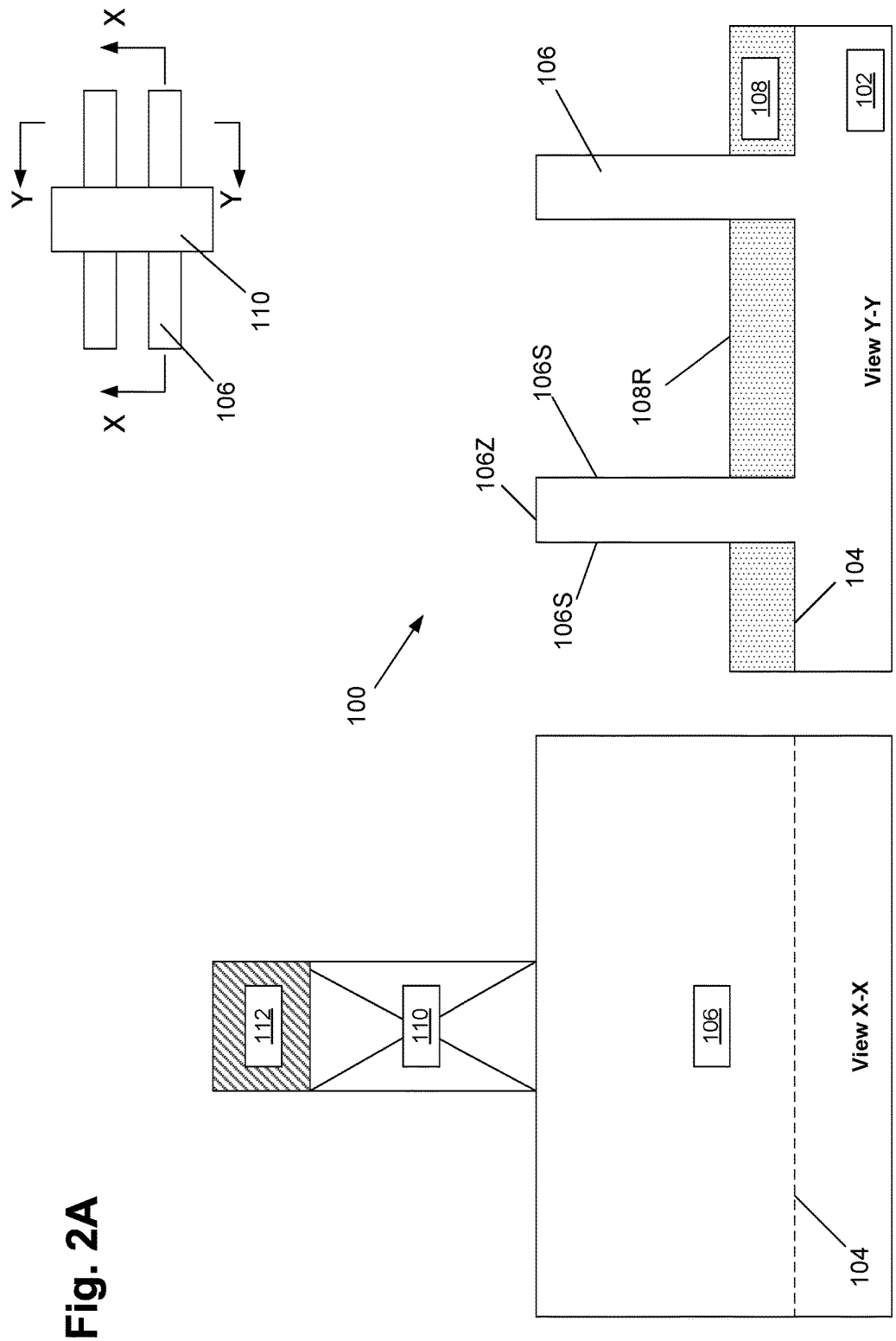

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming epi semiconductor material on the source/drain region of a FinFET device and the resulting devices. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. The gate structures for such devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2A-2I depict various methods disclosed herein for forming epi semiconductor material on a recessed fin in the source/drain regions of a FinFET device and the resulting device. Many of the figures contain a simplistic plan view showing where various cross-sectional views are taken in the drawings. The view X-X is a cross-sectional view taken through one of the fins 106 and the gate structure 110 of the FinFET device 100 (in a direction corresponding to the current transport (gate length) direction of the device). The view Y-Y is a cross-sectional view taken across the fins 106 through one of the source/drain regions of the device (in a direction corresponding to the gate width direction of the device). It should also be noted that no attempt has been made to reflect the processing shown in the cross-sectional views in the simplistic plan view so as to not overly complicate the drawings.

With reference to FIG. 2A, the illustrative product 100 will be formed in and above a semiconductor substrate 102. The product 100 may comprise either NMOS transistors, PMOS transistors or both types of transistors. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may also have a silicon-on-insulator (SOI) configuration (not shown) that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. The gate structures 110 for the illustrative transistor devices disclosed herein may be formed using well-known "gate first" or "replacement gate" manufacturing techniques.

FIG. 2A depicts the product 100 after several process operations were performed. First, one or more etching processes, e.g., anisotropic etching processes, were performed through a patterned fin-formation etch mask (not shown) to form a plurality of fin-formation trenches 104 in the substrate 102 and thereby define a plurality of fins 106. The patterned fin-formation hard mask may be comprised of one or more layer of materials and it may be formed to any desired overall thickness, e.g., the patterned fin-formation hard mask may be comprised of a relatively thin layer of silicon dioxide and a relatively thicker layer of silicon nitride. The patterned fin-formation hard mask may be formed by depositing the layer or layers of material of the patterned fin-formation hard mask above the upper surface of the substrate 102 and thereafter patterning those layers of material using known photolithography and etching techniques.

With continuing reference to FIG. 2A, the width and height of the fins 106 may vary depending upon the particular application. Additionally, the overall size, shape and configuration of the fin-formation trenches 104 and fins 106 may vary depending on the particular application. In the illustrative examples depicted in the attached drawings, the fin-formation trenches 104 and the fins 106 are all depicted as having a uniform size and shape. However, such uniformity in the size and shape of the trenches 104 and the fins 106 is not required to practice at least some aspects of the inventions disclosed herein. In the attached figures, the fin-formation trenches 104 are depicted as having been formed by performing an anisotropic etching process that results in the fins 106 having a schematically (and simplistically) depicted, generally rectangular configuration. In an actual real-world device, the sidewalls of the fins 106 may be somewhat outwardly tapered (i.e., the fins may be wider at the bottom of the fins than they are at the top of the fins) although that configuration is not depicted in the attached drawings. Thus, the size and configuration of the trenches 104 and the fins 106, and the manner in which they are made, should not be considered a limitation of the present invention. For ease of disclosure, only the substantially rectangular trenches 104 and fins 106 will be depicted in the subsequent drawings. Moreover, the FinFET device may be formed with any desired number of fins 106. In the example depicted herein, the FinFET device will be depicted as being comprised of two illustrative fins 106 at this point in the process flow. The fins 106 comprise opposing lateral sidewalls 106S and an upper surface 106Z.

Still referencing FIG. 2A, a layer of insulating material 108 (e.g., silicon dioxide) was then deposited so as to overfill the fin-formation trenches 104 and, thereafter, at least one process operation, such as a chemical mechanical polishing (CMP) process, was performed to planarize the upper surface of the layer of insulating material 108 with the upper surface of fins 106, thereby removing the patterned fin-formation hard mask. Next, a recess etching process was performed on the layer of insulating material 108 such that it has a recessed upper surface 108R that exposes a desired amount of the fins 106 above the recessed upper surface 108R.

Still with reference to FIG. 2A, after the layer of insulating material 108 was recessed, a simplistically depicted gate structure 110 with a gate cap 112 was formed above the fins 106. The gate structure 110 cover a portion of the fins 106 that will become the channel region of the device during operation. The gate structure 110 may be a final gate structure (a gate-first manufacturing process) or it may be a sacrificial gate structure (for a replacement gate manufacturing process). The gate structure 110 may be comprised of a gate insulation layer (not separately shown), e.g., silicon dioxide or a high-k material having a dielectric constant greater than 10, and a gate electrode comprised of one or more layers of conductive material (not separately shown), e.g., metal-containing materials. The gate cap 112 may be comprised of a material such as, for example, silicon nitride.

FIG. 2B depicts the device 100 after a conformal layer of first spacer material 114 was formed across the entire product including adjacent the fins 106 and the previously formed gate structure 110 by performing a conformal deposition process, e.g., a conformal ALD or CVD process. The thickness of the conformal layer of spacer material 114 may vary depending upon the particular application (e.g., 5-15 nm) and it may be made of a variety of materials, e.g., silicon nitride, SiBCN, SiOCN, SiCO, SiON, etc.

Figure 2C:
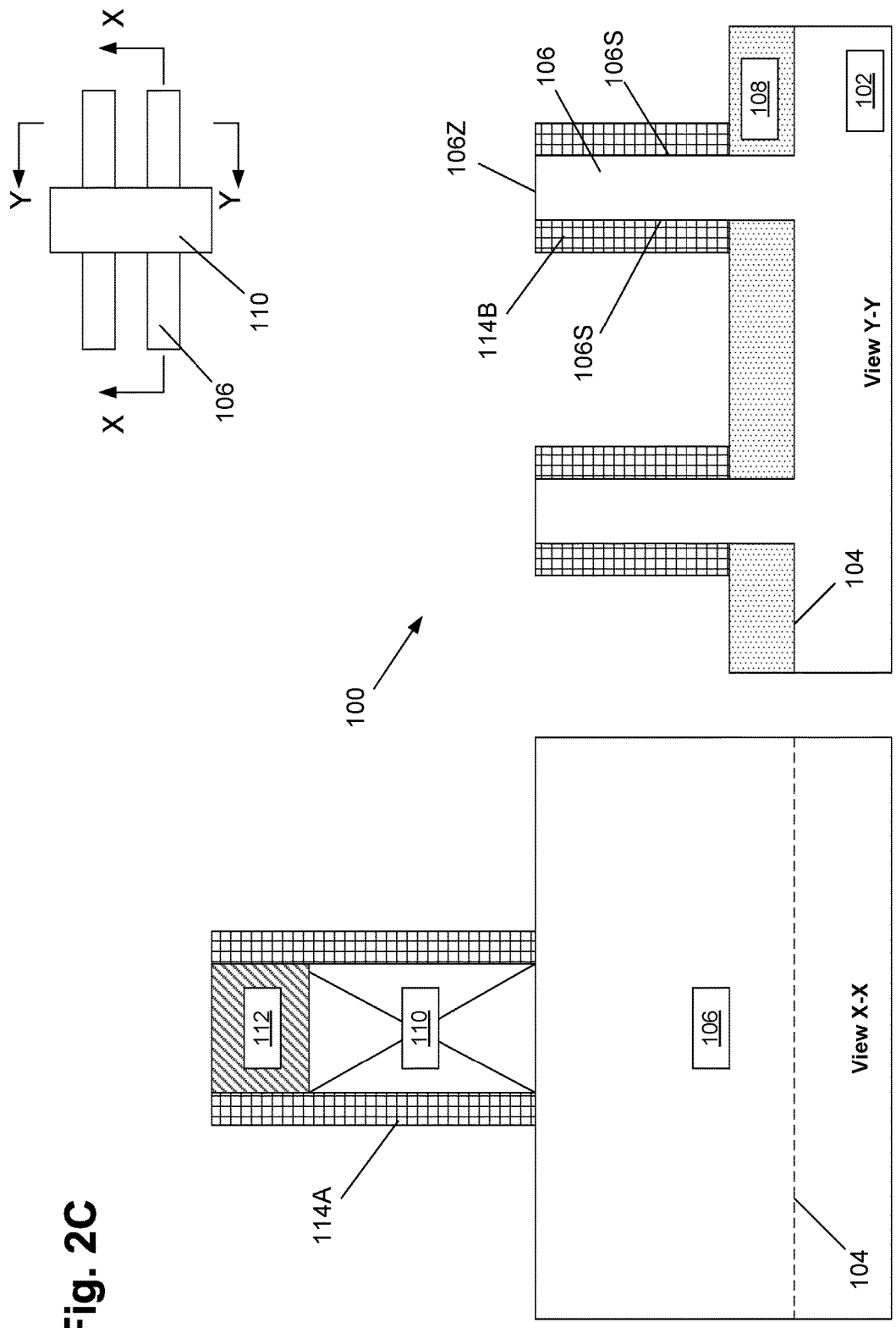

FIG. 2C depicts the product 100 after a substantially anisotropic etching process was performed to remove portions of the conformal layer of spacer material 114 positioned on generally horizontally oriented surfaces. The etching process was performed in such a manner so as to result in a gate spacer 114A positioned adjacent the gate structure 110 and a substantially full height fin spacer 114B positioned adjacent the opposing lateral sidewalls 106S of the fins 106. In one embodiment, the fin spacer 114B is about the same height as the exposed portion of the fin 106 above the recessed layer of insulating material 108, i.e., the fin spacer 114B covers substantially the entire exposed sidewalls 106S above the layer of insulating material 108. In some cases, the fin spacer 114B may only cover about 90% of the exposed height (or sidewalls 106S) of the fins 106. Note that the etching process is controlled and optimized such that the upper surface 106Z is exposed, i.e., the fin spacer 114B does not cover the upper surface 106Z of the fins 106.

FIG. 2D depicts the product 100 after an etching process was performed to remove portions of the fins 106 in the source/drain regions of the device 100 selective relative to the surrounding materials, including the fin spacers 114B, such that the fins 106 have a recessed surface 106R. The process results in the formation of a fin recess 106C between the fin spacer 114B for each of the fins 106. In one illustrative embodiment, the etching process is performed in such a manner that the recessed upper surface 106R of the fins 106 is positioned approximately level with the recessed upper surface 108R of the recessed layer of insulating material 108. In other cases, the etching process may be performed such that the recessed upper surface 106R of the fins 106 is slightly above or below (e.g., ±5 nm) the recessed upper surface 108R of the recessed layer of insulating material 108. Also note that, in one illustrative embodiment, the etching process is not absolutely anisotropic in nature and, as a result, the fin recess 106C may extend laterally under the gate spacer 114A by a distance 115. The distance 115 may vary depending upon the application and the parameters of the etch process, but, in one illustrative embodiment, with respect to current day devices, the distance 115 may be on the order of about 0.5-12 nm. In some applications, if desired, the fin recess 106C may be formed such that the recess 106C extends at least partially under the gate structure 110, as indicated by the dashed lines 115X.

FIG. 2E depicts the device 100 after an epi deposition process was performed to form a substantially rectangular-shaped epi semiconductor material 116 on the exposed portions of the fins 106 in the fin recess 106C between the fin spacer 114B in source/drain regions of the device. Or course, when it is stated that the epi semiconductor material 116 has a substantially rectangular configuration, geometric precision is not implied. That is, the epi semiconductor material 116 will generally grow to substantially conform to the shape of the recess 106C between the fin spacer 114B. In turn, the configuration of the space between the spacer 114B depends upon the shape of the fins 106 prior to recessing the fins 106. For example, if the original fins 106 have a tapered configuration, i.e., the fins 106 being wider at the bottom of the fin than they are at the top of the fin, the recess 106C between the spacer 114B will have a similar tapered configuration after the fin is recessed. In the drawings depicted herein, as noted earlier, the fins 106 have been depicted as being substantially rectangular in shape to simplify the drawings and the presentation herein. Thus, use of the phrase "substantially rectangular-shaped" to describe the configuration of the epi semiconductor material 116 should be understood to accommodate and account for variations in the shape of the original fins, e.g., tapered, from the idealized rectangular-shaped fins 106 depicted herein.

The epi semiconductor material 116 may be any type of semiconductor material, and it may be a different material for N- and P-type devices. In one illustrative example, for an N-type device, the epi semiconductor material 116 may be comprised of N-doped silicon, SiCP, etc. In another illustrative example, for a P-type device, the epi semiconductor material 116 may be comprised of P-doped germanium (Ge), a P-doped silicon germanium ($Si_{(1-x)}Ge_x$), etc. Note that the lateral growth of the epi material 116 on each fin 106 is restricted due to the presence of the fin spacer 114B. That is, the presence of the fin spacer 114B insures that the epi material 116 grown on a particular fin 106 will approximately assume the shape of the fin cavity 106C, i.e., a substantially rectangular-shaped structure (when viewed in the cross-sectional view Y-Y) instead of a traditional diamond-like or mushroom-like shape when epi material is grown on a recessed fin without any constraints on the lateral growth of the epi material. Accordingly, using the novel techniques disclosed herein, the epi material 116 will not grow too large laterally (in the gate width direction of the device), thereby reducing the chances of undesirable epi merger, which should make the formation of FinFET devices with small fin pitches easier. In one illustrative embodiment, the epi material 116 may be a doped epi material that is doped in situ as it is being formed with the appropriate dopant material, e.g., an N-type dopant for an N-type device or a P-type dopant for a P-type device. In one particular embodiment, the epi material 116 may be relatively lightly doped in comparison to another doped region that will be formed in the epi material 116 as described more fully below.

FIG. 2F depicts the device 100 after an anisotropic reactive ion etching (ME) process was performed to remove substantially all of the fin spacer 114B from the epi material 116 in the source/drain regions of the device 100. Of course, in comparing FIGS. 2E and 2F, some of the thickness of the gate spacer 114A, some of the height of the gate spacer 114A and a portion of the initial thickness of the gate cap 112 may be consumed during this etching process as well. The etch process is controlled to insure that enough of the gate cap 112 and the spacer 114A remain to protect the materials of the gate structure 110.

Figure 2G:
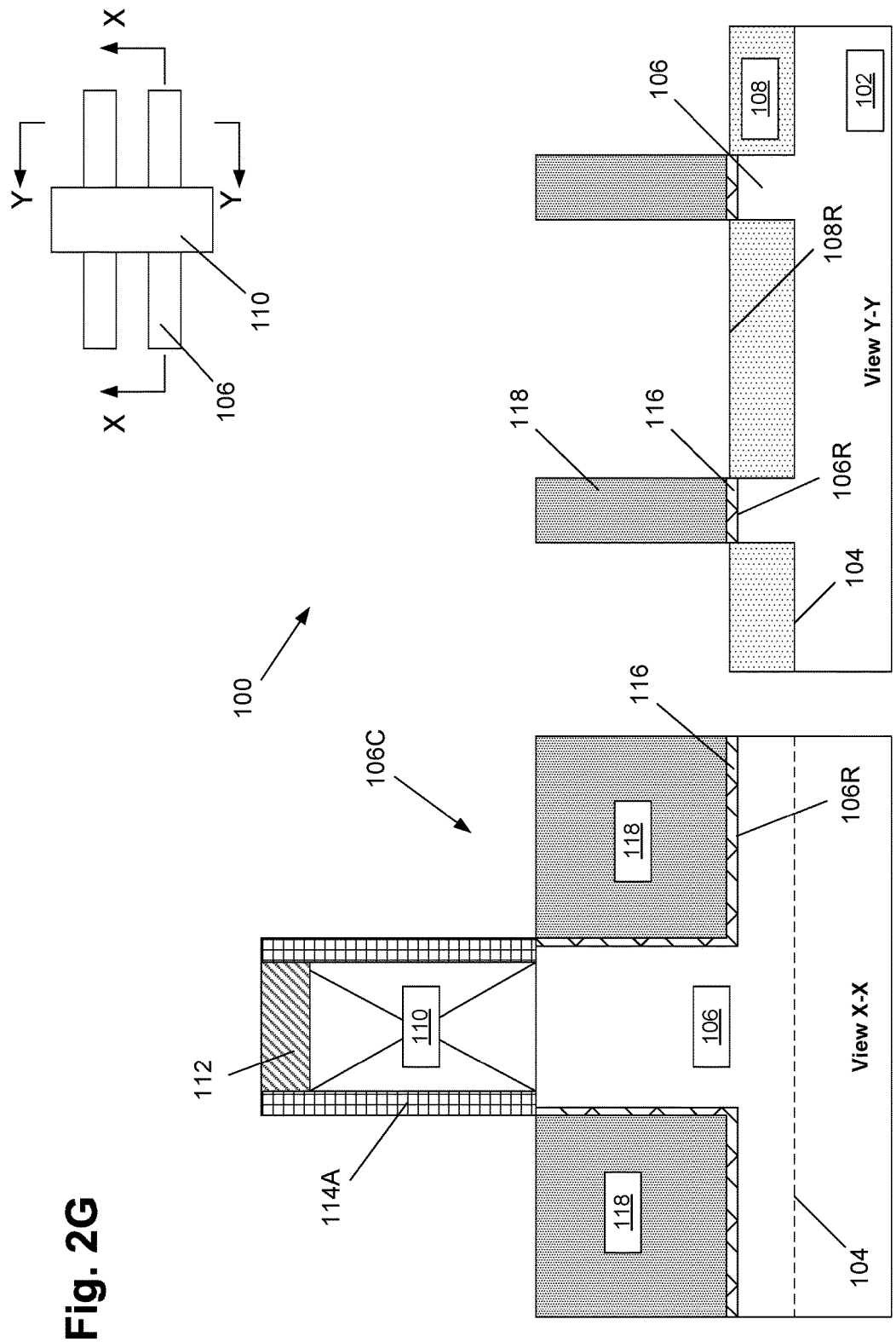

FIG. 2G depicts the device 100 after a doped region 118 was formed in the epi material 116. The doped region 118 may be formed by any of a variety of techniques, e.g., plasma doping, doped oxide drive in, ion implantation, etc. In the case where the epi material 116 is doped, the doped region 118 is doped with the same type of dopant as that as is present in the doped epi region 116. Of course, the doped region 118 comprises the appropriate dopant material for the particular device under construction, e.g., an N-type dopant for an N-type device or a P-type dopant for a P-type device. As noted above, the doped region 118 may have a relatively higher concentration of dopant atoms than the dopant concentration of the doped epi material 116 so as to provide a dopant gradient from the channel region of the device 100 to the source/drain regions of the device 100. The difference in the dopant concentration of the doped region 118 and the doped epi material 116 may vary depending upon the particular application. In one illustrative example, the doped region 118 may have a dopant concentration that is about 2-50 times greater than the dopant concentration of the doped epi material 116.

FIG. 2H depicts the device 100 after another epi deposition process was performed to form a substantially conformal epi cladding layer 120 on all of the exposed surfaces of the epi semiconductor material 116 above the layer of insulating material 108 in the source/drain regions of the device 100. That is, the epi semiconductor material 116 is effectively embedded within the conformal epi cladding layer 120. Considered collectively, the combination of the epi material 116 and the conformal cladding layer 120 constitute the substantially rectangular-shaped conductive source/drain materials 121 formed in the source/drain regions of the device 100 that will ultimately be contacted by a conductive source/drain contact structure 124, as described more fully below. In one illustrative embodiment, the conductive source/drain materials 121 have at least the same volume of epi material as compared to the prior art diamond-shaped epi material 24, while the lateral width 125 of the conductive source/drain materials 121 is less than the lateral width 24W of the prior art diamond-shaped epi material 24, thereby enabling the formation of devices with smaller fin pitches. The epi cladding layer 120 is beneficial in that it provides additional epi material, at least some of which will be consumed when a silicide material is formed in the source/drain regions. If the additional epi cladding layer 120 were not formed, then the subsequent silicidation process would consume portions of the epi material 116 thereby reducing the overall volume of epi material on the device, which may lead to undesirable high current crowding and an undesirable increase in resistance. The formation of the epi material 116 and the relatively heavier doped region 118 therein is also beneficial in that, if the epi cladding layer 120 were simply grown on the original fin, it would be difficult to deliver enough dopant under the gate spacer 114A, The epi cladding layer 120 may be comprised of any type of semiconductor material and it may be different for N-type devices and for P-type devices. In one illustrative example, for an N-type device, the epi cladding layer 120 may be comprised of N-doped silicon, SiCP, etc. In another illustrative example, for a P-type device, the epi cladding material 120 may be comprised of P-doped germanium (Ge), a P-doped silicon germanium ($Si_{(1-x)}Ge_x$), etc. The epi cladding material 120 may be formed to any desired thickness and it may be formed in a doped (in situ doping) or an undoped condition.

In one illustrative example, various forming gases may be used to form the substantially conformal epi cladding layer 120. For example, in the case where the substrate 102 is a (100) silicon substrate, and wherein a long axis of the fin 106 is oriented in a <110> crystallographic direction of the substrate, the substantially conformal epi cladding layer 120 may be formed by performing an epitaxial deposition process using a combination of silane ($SiH_4$) (silicon source), dichlorosilane ($SiH_2Cl_2$) (silicon source), and germane ($GeH_4$) (germanium source) as precursor gases and hydrogen as a carrier gas to form a silicon germanium ($Si_{(1-x)}Ge_x$) conformal epi cladding layer 120 on the exposed surfaces of the fin 106, wherein the flow rate of dichlorosilane used during the epitaxial deposition process is equal to 10-90% of the combined flow rate of silane and dichlorosilane.

FIG. 2I only depicts the cross-sectional view Y-Y that is taken through the source/drain regions of the device 100. FIG. 2I depicts the product after several process operations were performed to form a conductive source/drain contact structure 124, e.g., a trench silicide material 123 that is conductively coupled to the substantially conformal epi cladding layer 120 formed on the epi material 116. Note that, in forming the trench silicide material 123, some of the epi cladding layer 120 material is consumed. Initially, a layer of insulating material 122, e.g., silicon dioxide, may be blanket-deposited across the substrate 102. Thereafter, source/drain contact openings 122A may be defined in the layer of insulating material 122 so as to expose portions of underlying source/drain regions. Thereafter, the conductive source/drain contact structure 124 was formed by forming a traditional metal silicide region 123 through the source/drain contact openings 122A on the conformal epi cladding layer 120, followed by forming tungsten (not separately shown) on the metal silicide region 123. At that point, a chemical mechanical polishing (CMP) process was performed to remove excess conductive materials positioned outside of the source/drain contact openings 122A. As can be seen in FIG. 2I, by forming the substantially rectangular-shaped epi material 116 between the fin spacer 114B, and forming the conformal epi cladding layer 120 on the epi material 116, the overall width 125 of the conductive materials to be contacted by the conductive source/drain contact structure 124 may be less than the overall width 24W (see FIG. 1B) of the diamond-shaped epi materials 24 formed using prior art processing techniques. As a result, using the method disclosed herein, FinFET devices may be manufactured using smaller fin pitches. Additionally, using the methods disclosed herein, the conductive source/drain contact structure 124 may be formed on all exposed surfaces of the conformal epi cladding layer 120, i.e., the conductive source/drain contact structure 124 may be formed all around the conductive source/drain materials 121 (the combination of the epi material 116 and the conformal cladding layer 120). As a result, the methods disclosed herein permit the formation of substantially rectangular-shaped conductive source/drain materials 121 having at least the same volume of epi material as compared to the prior art diamond-shaped epi material 24, while the lateral width 125 of the conductive source/drain materials 121 is less than the lateral width 24W of the prior art diamond-shaped epi material 24, thereby enabling the formation of devices with smaller fin pitches.

One illustrative FinFET device disclosed herein includes, among other things, a gate structure positioned around a silicon fin 106 and above the layer of insulating material 108. A fin recess 106C is defined in the fin 106 and a substantially rectangular-shaped epi semiconductor material 116 is positioned within the fin recess 106C. In this example, the device further includes a doped region 118 in the substantially rectangular-shaped epi material 116 and a conformal epi cladding layer 120 positioned on substantially all surfaces of the substantially rectangular-shaped epi semiconductor material 116 positioned above the layer of insulating material 108. In one illustrative example where the FinFET device is a P-type device, the fin 106 may comprise silicon, the epi semiconductor material 116 may comprise silicon germanium ($Si_{(1-x)}Ge_x$) and the conformal epi cladding layer 120 may comprise silicon germanium ($Si_{(1-x)}Ge_x$). In another illustrative example where the FinFET device is an N-type device, the fin 106 may comprise silicon, the epi semiconductor material 116 may comprise N-doped silicon and the conformal epi cladding layer 120 may comprise N-doped silicon. Importantly, in one illustrative example, the channel portion of the device may have a substantially rectangular configuration (as defined by the original fin structure 106) that is comprised of a first material, such a silicon, while the source/drain region of the device may comprise substantially rectangular-shaped source/drain materials 121 that are comprised of one or more semiconductor materials that are different from the material of the channel portion of the FinFET device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required.

Accordingly, the protection sought herein is as set forth in the claims below.

What is claimed:

1. A method of forming epi semiconductor material on a recessed fin in source/drain regions of a FinFET device, comprising:
    forming a gate structure around a fin and above a layer of insulating material;
    forming a gate spacer adjacent said gate structure and a fin spacer positioned adjacent opposing lateral sidewalls of said fin in said source/drain regions above said layer of insulating material, said fin spacer and said gate spacer comprising a same material, said fin spacer leaving an upper surface of said fin exposed;
    performing at least one etching process to remove at least a first portion of said fin positioned between said fin spacer and a second portion of said fin disposed laterally beneath said gate spacer, said fin having a recessed upper surface that at least partially defines a fin recess positioned between said fin spacer, wherein a portion of said fin recess extends laterally under at least a portion of said gate spacer defined by the removal of said second portion;
    forming an epi semiconductor material on said recessed upper surface of said fin and within said fin recess; and
    removing said fin spacer from adjacent said epi semiconductor material while leaving a portion of said gate spacer in position adjacent said gate structure, wherein removing said fin spacer from adjacent said epi semiconductor material while leaving a portion of said gate spacer in position adjacent said gate structure comprises performing an anisotropic reactive ion etching process.

2. The method of claim 1, wherein forming said gate spacer adjacent said gate structure and said fin spacer positioned adjacent said opposing lateral sidewalls of said fin comprises:
    forming a conformal layer of spacer material on said gate structure, on said opposing lateral sidewalls and said upper surface of said fin and above said layer of insulating material; and
    performing an anisotropic etching process to remove portions of said conformal layer of said spacer material positioned on substantially horizontally oriented surfaces, thereby resulting in the formation of said gate spacer and said fin spacer.

3. The method of claim 1, wherein forming said gate spacer adjacent said gate structure and said fin spacer positioned adjacent said opposing lateral sidewalls of said fin comprises forming said fin spacer such that it covers substantially all of said opposing lateral sidewalls of said fin.

4. The method of claim 1, wherein performing said at least one etching process to remove said at least a first portion of said fin positioned between said fin spacer comprises performing said at least one etching process such that said recessed upper surface of said fin is positioned at a level that is below a level of an upper surface of said layer of insulating material.

5. The method of claim 1, wherein performing said at least one etching process to remove said at least said second portion of said fin comprises performing said at least one etching process such that a portion of said fin recess extends laterally under at least a portion of said gate structure.

6. The method of claim 1, wherein forming said epi semiconductor material on said recessed upper surface of said fin and within said fin recess comprises forming a substantially rectangular-shaped epi semiconductor material on said recessed upper surface of said fin and within said fin recess.

7. The method of claim 1, further comprising forming a doped region in said epi semiconductor material.

8. The method of claim 7, wherein forming said doped region comprises performing one of a plasma doping process, a doped oxide doping process or an ion implantation process.

9. The method of claim 6, wherein said substantially rectangular-shaped epi semiconductor material is a doped substantially rectangular-shaped epi semiconductor material that has a first concentration of a first type of dopant and wherein the method further comprises forming a doped region in said doped substantially rectangular-shaped epi semiconductor material, wherein said doped region has a second concentration of said first type of dopant that is greater than said first concentration.

10. A method of forming epi semiconductor material on a recessed fin in source/drain regions of a FinFET device, comprising:
    forming a gate structure around a fin and above a layer of insulating material;
    forming a gate spacer adjacent said gate structure and a fin spacer positioned adjacent opposing lateral sidewalls of said fin in said source/drain regions above said layer of insulating material, said fin spacer and said gate spacer comprising a same material, said fin spacer leaving an upper surface of said fin exposed;
    performing at least one etching process to remove at least a first portion of said fin positioned between said fin spacer and a second portion of said fin disposed laterally beneath said gate spacer, said fin having a recessed upper surface that at least partially defines a fin recess positioned between said fin spacer, wherein a portion of said fin recess extends laterally under at least a portion of said gate spacer defined by the removal of said second portion;
    forming a doped epi semiconductor material on said recessed upper surface of said fin and within said fin recess, wherein said doped epi semiconductor material has a first concentration of a first type of dopant;
    removing said fin spacer from adjacent said doped epi semiconductor material while leaving a portion of said gate spacer in position adjacent said gate structure, wherein removing said fin spacer from adjacent said epi semiconductor material while leaving a portion of said gate spacer in position adjacent said gate structure comprises performing an anisotropic reactive ion etching process;

forming a doped region in said doped epi semiconductor material, wherein said doped region has a second concentration of said first type of dopant that is greater than said first concentration; and forming a conformal epi cladding layer on substantially all surfaces of said doped epi semiconductor material positioned above said layer of insulating material.

11. The method of claim 10, wherein forming said gate spacer adjacent said gate structure and said fin spacer positioned adjacent said opposing lateral sidewalls of said fin comprises forming said fin spacer such that it covers substantially all of said opposing lateral sidewalls of said fin.

12. The method of claim 10, wherein forming said doped epi semiconductor material comprises forming a substantially rectangular-shaped doped epi semiconductor material.

13. The method of claim 10, wherein performing said at least one etching process to remove at least said second portion of said fin positioned between said fin spacer comprises performing said at least one etching process such that a portion of said fin recess extends laterally under at least a portion of said gate structure.

14. A method of forming epi semiconductor material on a recessed fin in source/drain regions of a FinFET device, comprising:

forming a gate structure around a fin and above a layer of insulating material;

forming a gate spacer adjacent said gate structure and a fin spacer positioned adjacent opposing lateral sidewalls of said fin in said source/drain regions above said layer of insulating material, said fin spacer and said gate spacer comprising a same material, said fin spacer leaving an upper surface of said fin exposed;

performing at least one etching process to remove at least a portion of said fin positioned between said fin spacer, said fin having a recessed upper surface that at least partially defines a fin recess positioned between said fin spacer;

forming an epi semiconductor material on said recessed upper surface of said fin and within said fin recess; and performing an anisotropic reactive ion etching process to remove said fin spacer from adjacent said epi semiconductor material while leaving a portion of said gate spacer in position adjacent said gate structure.

15. The method of claim 14, wherein performing said at least one etching process to remove said at least said portion of said fin comprises performing said at least one etching process such that a portion of said fin recess extends laterally under at least a portion of said gate structure.

16. The method of claim 14, wherein forming said epi semiconductor material on said recessed upper surface of said fin and within said fin recess comprises forming a substantially rectangular-shaped epi semiconductor material on said recessed upper surface of said fin and within said fin recess.

17. The method of claim 14, further comprising forming a doped region in said epi semiconductor material.

18. The method of claim 16, wherein said substantially rectangular-shaped epi semiconductor material is a doped substantially rectangular-shaped epi semiconductor material that has a first concentration of a first type of dopant and wherein the method further comprises forming a doped region in said doped substantially rectangular-shaped epi semiconductor material, wherein said doped region has a second concentration of said first type of dopant that is greater than said first concentration.

* * * * *